(12) United States Patent
Nakata

(10) Patent No.: US 10,177,109 B2
(45) Date of Patent: Jan. 8, 2019

(54) METHOD OF MANUFACTURING SEMICONDUCTOR DEVICE

(71) Applicant: Mitsubishi Electric Corporation, Tokyo (JP)

(72) Inventor: Yosuke Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/566,038

(22) PCT Filed: May 26, 2015

(86) PCT No.: PCT/JP2015/064998
§ 371 (c)(1),
(2) Date: Oct. 12, 2017

(87) PCT Pub. No.: WO2016/189643
PCT Pub. Date: Dec. 1, 2016

(65) Prior Publication Data
US 2018/0114766 A1    Apr. 26, 2018

(51) Int. Cl.
*H01L 23/00*    (2006.01)
*H01L 21/304*    (2006.01)
(Continued)

(52) U.S. Cl.
CPC ............ *H01L 24/27* (2013.01); *H01L 21/304* (2013.01); *H01L 21/3205* (2013.01); *H01L 21/32134* (2013.01); *H01L 21/768* (2013.01); *H01L 21/82* (2013.01); *H01L 23/49562* (2013.01); *H01L 23/522* (2013.01); *H01L 23/585* (2013.01); *H01L 24/29* (2013.01); *H01L 24/30* (2013.01); *H01L 24/94* (2013.01);
(Continued)

(58) Field of Classification Search
CPC ................ H01L 21/304; H01L 2224/30181
See application file for complete search history.

(56) References Cited

U.S. PATENT DOCUMENTS

2014/0374904 A1    12/2014    Matsumoto et al.

FOREIGN PATENT DOCUMENTS

JP    H04-101451 A    4/1992
JP    2008-182074 A    8/2008
(Continued)

OTHER PUBLICATIONS

International Search Report issued in PCT/JP2015/064998; dated Aug. 11, 2015.

*Primary Examiner* — Eliseo Ramos Feliciano
*Assistant Examiner* — Mikka Liu
(74) *Attorney, Agent, or Firm* — Studebaker & Brackett PC

(57) ABSTRACT

The present invention includes: preparing a semiconductor substrate having a first main surface and a second main surface that is located on an opposite side of the first main surface; forming a first electrode on the first main surface; forming a solder-bonding metal film (a first solder-bonding metal film) on the first electrode; forming a sacrificial film on the first solder-bonding metal film; grinding the second main surface after forming the sacrificial film; performing heat treatment after the grinding (forming an element structure on the third main surface side); removing the sacrificial film after the performing heat treatment; and solder-bonding the first solder-bonding metal film and a first external electrode.

10 Claims, 10 Drawing Sheets

(51) Int. Cl.
  *H01L 21/3205* (2006.01)
  *H01L 23/522* (2006.01)
  *H01L 21/768* (2006.01)
  *H01L 21/3213* (2006.01)
  *H01L 21/82* (2006.01)
  *H01L 23/495* (2006.01)
  *H01L 23/58* (2006.01)
  *H01L 21/225* (2006.01)
  *H01L 29/08* (2006.01)

(52) U.S. Cl.
  CPC ........ *H01L 21/2253* (2013.01); *H01L 29/083* (2013.01); *H01L 2224/27009* (2013.01); *H01L 2224/27019* (2013.01); *H01L 2224/2745* (2013.01); *H01L 2224/2747* (2013.01); *H01L 2224/29155* (2013.01); *H01L 2224/29644* (2013.01); *H01L 2224/30181* (2013.01); *H01L 2224/32245* (2013.01); *H01L 2224/48247* (2013.01); *H01L 2224/48472* (2013.01); *H01L 2224/73265* (2013.01); *H01L 2924/181* (2013.01)

(56) References Cited

FOREIGN PATENT DOCUMENTS

| | | | |
|---|---|---|---|
| JP | 2009-152459 A | 7/2009 | |
| JP | 2010-272711 A | 12/2010 | |
| JP | 2013-065737 A | 4/2013 | |
| JP | 2013065737 A * | 4/2013 | ............ H01L 24/05 |
| JP | 2013-187350 A | 9/2013 | |

\* cited by examiner

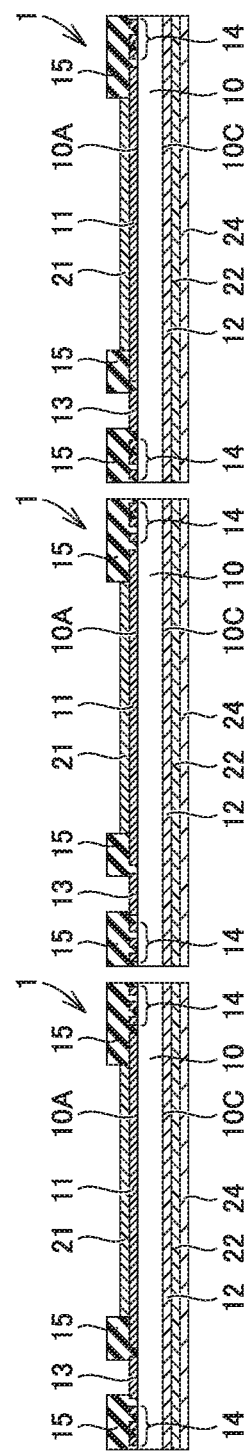

METHOD OF MANUFACTURING SEMICONDUCTOR DEVICE

TECHNICAL FIELD

The present invention relates to a method of manufacturing a semiconductor device, and particularly to a method of manufacturing a semiconductor device in which a semiconductor element and an external electrode are solder-bonded to each other.

BACKGROUND ART

There is a known semiconductor device in which an electrode formed on a semiconductor element and an external electrode are solder-bonded to each other (for example, see Japanese Patent Laying-Open No. 2008-182074). By directly bonding the electrode on the semiconductor element and the external electrode to each other with solder, it becomes possible to implement a wiring connection by which an electrical resistance is lowered to thereby allow passage of a large current.

There is also a known semiconductor device in which an anti-oxidizing film for suppressing formation of an oxide film is formed on an electrode of a semiconductor element to be solder-bonded. Japanese Patent Laying-Open No. 2010-272711 discloses a semiconductor device including a semiconductor element having an electrode on which an additional electrode is formed, the additional electrode being formed by stacking a conductor layer made of nickel (Ni) as a solder-bonding metal film and an anti-oxidizing layer made of gold (Au), silver (Ag) or the like as a film for preventing oxidation of the conductor layer.

CITATION LIST

Patent Document

PTD 1: Japanese Patent Laying-Open No. 2008-182074
PTD 2: Japanese Patent Laying-Open No. 2010-272711

SUMMARY OF INVENTION

Technical Problem

However, the conventional anti-oxidizing film is formed of expensive noble metal materials such as Au or Ag as described above, which poses a problem that the manufacturing cost for a semiconductor device is raised.

Also, in a power semiconductor device, for the purpose of improving a current-carrying performance, a semiconductor substrate is thinly ground to obtain a ground surface on which an electrode is formed. In this case, before grinding, if a heavy metal forming a solder-bonding metal film is exposed on the surface that is not ground, or if an anti-oxidizing film for example made of a heavy metal material is formed on the solder-bonding metal film, the heavy-metal materials adheres, during grinding, to the ground surface from which a semiconductor substrate material (for example, silicon (Si)) is exposed. Thus, through the heat treatment step such as thermal diffusion performed after grinding, the heavy metal materials are taken into the substrate material, thereby exerting a serious influence upon the life time of carriers in the element. Accordingly, the conventionally-used method of manufacturing a semiconductor device has been a method of forming a solder-bonding metal film and an anti-oxidizing film on the not-ground surface after forming an electrode on the ground surface to cover the ground surface and before the heat treatment step. Metal elements having an atomic number equal to or less than 22 and excluding an alkali metal and an alkaline earth metal are less likely to exert influences upon the semiconductor characteristics such as the life time of carriers in the element or the ohmic contact on the ground surface. Thus, such metal elements can be deposited on the not-ground surface before grinding. On the other hand, metal elements such as a heavy metal, an alkali metal, and an alkaline earth metal having an atomic number equal to or greater than 26, or metal elements having magnetism are more likely to exert influences upon the semiconductor characteristics such as the life time of carriers in the element or the ohmic contact on the ground surface. Therefore, it is desirable to avoid deposition of such metal elements on the not-ground surface before grinding.

However, when an anti-oxidizing film and the like are formed on the surface that is not ground even after grinding, cracking may occur in the semiconductor substrate during conveyance, film formation and the like, which causes a problem of a yield reduction.

The present invention has been made to solve the above-described problems. A main object of the present invention is to provide a method of manufacturing a semiconductor device, by which the manufacturing cost is reduced, cracking in a semiconductor substrate is suppressed, a semiconductor element can be formed that does not exert an influence upon the life time even if a solder-bonding metal film is formed before wafer grinding, and oxidation of the solder-bonding metal film is prevented so that the solder-bonding metal film and an external electrode are excellently solder-bonded to each other.

Solution to Problem

A method of manufacturing a semiconductor device according to the present invention includes: preparing a semiconductor substrate having a first main surface and a second main surface that is located on an opposite side of the first main surface; forming a first electrode on the first main surface; forming a solder-bonding metal film on the first electrode; forming a sacrificial film on the solder-bonding metal film; grinding the second main surface after forming the sacrificial film; performing heat treatment after the step of grinding; removing the sacrificial film after the performing heat treatment; and solder-bonding the solder-bonding metal film and an external electrode.

Advantageous Effects of Invention

According to the present invention, a method of manufacturing a semiconductor device can be provided, by which heat treatment is performed in the state where a sacrificial film is formed on a solder-bonding metal film, so as to suppress thermal oxidation of the solder-bonding metal film, thereby preventing oxidation of the solder-bonding metal film, with the result that the solder-bonding metal film and the external electrode are excellently solder-bonded. Furthermore, the sacrificial film is eventually removed from the semiconductor device and the sacrificial film itself can be thermally oxidized. Accordingly, the sacrificial film does not have to be made of a noble metal like an anti-oxidizing film that is not removed from the semiconductor device and remained thereon. Thus, it becomes possible to provide a method of manufacturing a semiconductor device, by which the manufacturing cost is reduced. Furthermore, even if a solder-bonding metal film is formed before grinding a wafer, a semiconductor element that does not exert an influence upon the life time can be formed. Furthermore, since the step of forming an anti-oxidizing film and the like on the first main surface is not performed after the grinding step, it becomes possible to provide a method of manufacturing a semiconductor device, by which occurrence of cracking in a semiconductor substrate is suppressed.

BRIEF DESCRIPTION OF DRAWINGS

FIG. 10 is a cross-sectional view for illustrating the method of manufacturing a semiconductor device according to the present embodiment.

DESCRIPTION OF EMBODIMENTS

Figure 1:
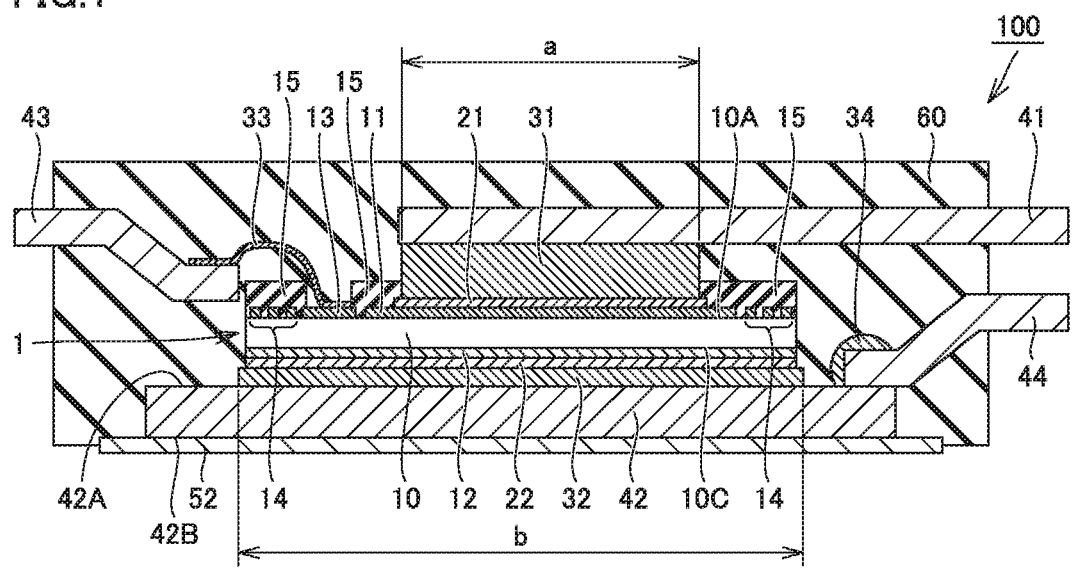
FIG. 1 is a cross-sectional view for illustrating a semiconductor device according to the present embodiment.
Figure 2:
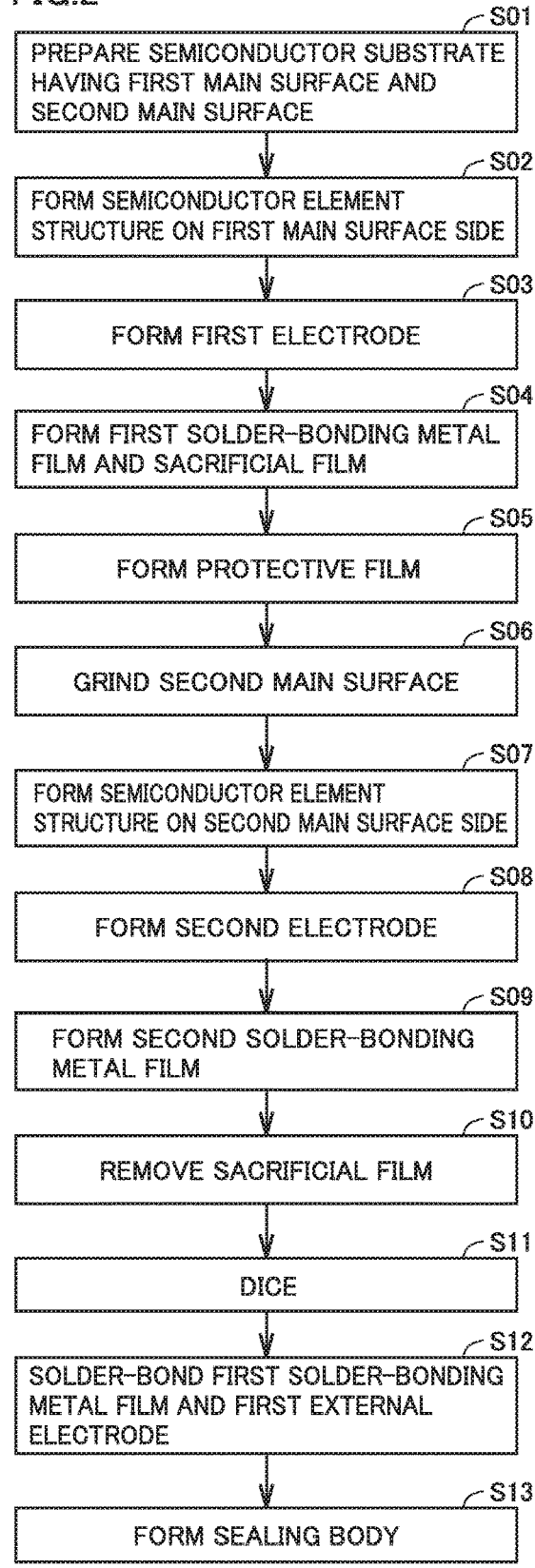
FIG. 2 is a flowchart of a method of manufacturing a semiconductor device according to the present embodiment.

The embodiments of the present invention will be hereinafter described with reference to the accompanying drawings, in which the same or corresponding components are designated by the same reference characters, and description thereof will not be repeated.

Referring to FIG. 1, a semiconductor device 100 according to the present embodiment will be hereinafter described. Semiconductor device 100 includes a semiconductor element 1 formed on a semiconductor substrate 10.

Semiconductor substrate 10 has a first main surface 10A and a third main surface 10C that is located on the opposite side of first main surface 10A. Third main surface 10C is a ground surface formed by partially grinding a second main surface 10B of semiconductor substrate 10, which is located on the opposite side of first main surface 10A (see FIGS. 3 to 7). Semiconductor element 1 may have any element structure and, for example, may be formed as a vertical-type Insulated Gate Bipolar Transistor (IGBT) or a Metal-Oxide-Semiconductor Field-Effect Transistor (MOSFET), or may be formed as a rectifier diode. It is to be noted that FIGS. 1 to 10 do not show the element structure.

On first main surface 10A, a first electrode 11 serving as a main current path of semiconductor element 1 and a control electrode 13 are formed. On first electrode 11, a first solder-bonding metal film 21 is formed. First solder-bonding metal film 21 is connected to a first external electrode 41 via solder 31. First solder-bonding metal film 21 and first external electrode 41 are solder-bonded to each other. Control electrode 13 is connected to a third external electrode 43 through a metal wire 33. In other words, control electrode 13 and third external electrode 43 are wire-bonded to each other.

Furthermore, a guard ring 14 is formed so as to surround first electrode 11 and control electrode 13 on first main surface 10A. In other words, a breakdown voltage holding region is formed so as to surround a cell region in which the element structure of semiconductor element 1 is formed. When semiconductor element 1 is formed as an IGBT, for example, first electrode 11 is formed as an emitter electrode while control electrode 13 is formed as a gate electrode. A protective film 15 is formed on first main surface 10A. Although protective film 15 may be formed on the breakdown voltage holding region in which at least guard ring 14 is formed, but this protective film 15 may be formed on first main surface 10A such that an opening is provided on first electrode 11 and control electrode 13.

On third main surface 10C, a second electrode 12 serving as a main current path of semiconductor element 1 is formed. On second electrode 12, a second solder-bonding metal film 22 is formed. Second solder-bonding metal film 22 is connected to second external electrodes 42 and 52 via solder 32. Second external electrodes 42 and 52 are bonded to each other by stacking an upper electrode 42 and a lower electrode 52 on one another. Second solder-bonding metal film 22 and upper electrode 42 are solder-bonded to each other. Upper electrode 42 is connected to a fourth external electrode 44 via solder 34.

Except for a part of each of first external electrode 41, lower electrode 52 of second external electrodes 42 and 52, third external electrode 43, and fourth external electrode 44, semiconductor device 100 is sealed by a sealing body 60.

The material forming semiconductor substrate 10 is silicon, for example. The material forming each of first electrode 11 and control electrode 13 may be any material having electrical conductivity, and preferably contains 95 mass % or more of aluminum (Al). The material forming second electrode 12 contains Al, for example.

Solder 31, solder 32 and solder 34 may be made of any solder material, and a main constituent material thereof is Sn.

The material forming each of first solder-bonding metal film 21 and second solder-bonding metal film 22 contains nickel (Ni), for example. Specifically, the material forming each of first solder-bonding metal film 21 and second solder-bonding metal film 22 may contain a metal element having an atomic number equal to or greater than 23. In this way, tin (Sn) as a main constituent material of solder 31 and an intermetallic compound can be readily formed, and can be readily solder-bonded by a well-known method. The film thickness of first solder-bonding metal film 21 may be arbitrarily set in accordance with the condition for bonding to first external electrode 41 via solder 31. For example, the film thickness of first solder-bonding metal film 21 is 0.5 μm or more and 5 μm or less, and preferably about 1 μm. The film thickness of second solder-bonding metal film 22 may be arbitrarily set in accordance with the condition for bonding to upper electrode 42 via solder 32, the condition for dicing semiconductor substrate 10, and the like. For example, the film thickness of second solder-bonding metal film 22 is 0.5 μm or more and 5 μm or less, and preferably about 1 μm. In this way, the mechanical strength of each of first solder-bonding metal film 21 and second solder-bonding metal film 22 can be maintained before and after first solder-bonding metal film 21 is solder-bonded to first external electrode 41 or before and after second solder-bonding metal film 22 is solder-bonded to second external electrodes 42 and 52. Consequently, it becomes possible to ensure the reliability of the bonding interface between first solder-bonding metal film 21 and first external electrode 41, and also possible to ensure the reliability of the bonding interface between second solder-bonding metal film 22 and upper electrode 42. Furthermore, by setting the film thickness of each of first solder-bonding metal film 21 and second solder-bonding metal film 22 to fall within the above-described value range, first solder-bonding metal film 21 and second solder-bonding metal film 22 can be readily formed. Consequently, the processing time in each of the step of forming first solder-bonding metal film 21 and the step of forming second solder-bonding metal film 22 can be shortened, and also, a reduction of the manufacturing yield can be suppressed.

The material forming protective film 15 may be any material having an electrical insulation property and, for example, contains polyimide (photosensitive polyimide or non-photosensitive polyimide).

The material forming metal wire 33 may be any material having electrical conductivity and, for example, contains Al. Metal wire 33 is formed as an Al wire, for example.

The material forming each of first external electrode 41, second external electrodes 42 and 52, third external electrode 43, and fourth external electrode 44 may be any material having electrical conductivity and, for example, contains copper (Cu). First external electrode 41, second external electrodes 42 and 52, third external electrode 43, and fourth external electrode 44 each are formed as a Cu plate, for example.

The material forming sealing body 60 may be any material having an electrical insulation property and, for example, is a resin material, which is a gel-like resin material before curing, for example.

Referring to FIGS. 2 to 10, the method of manufacturing a semiconductor device according to the present embodiment will be hereinafter described.

First, semiconductor substrate 10 is prepared (step (S01)). Semiconductor substrate 10 has first main surface 10A and second main surface 10B that is located on the opposite side of first main surface 10A. The film thickness of semiconductor substrate 10 (the distance between first main surface 10A and second main surface 10B) is thicker than the film thickness required as semiconductor element 1 (the film thickness of semiconductor substrate 10 in semiconductor device 100) and is 750 µm, for example.

Then, an element structure (not shown) of semiconductor element 1 is formed on the first main surface 10A side of semiconductor substrate 10 (step (S02)). Specifically, the element structure on the first main surface 10A side is formed, for example, by ion implantation or thermal diffusion into first main surface 10A of semiconductor substrate 10. When semiconductor element 1 is formed as an IGBT, the present step (S01) includes the step of forming a gate insulating film, thereby forming an element structure of an insulated gate field effect transistor on the first main surface 10A side.

Figure 3:
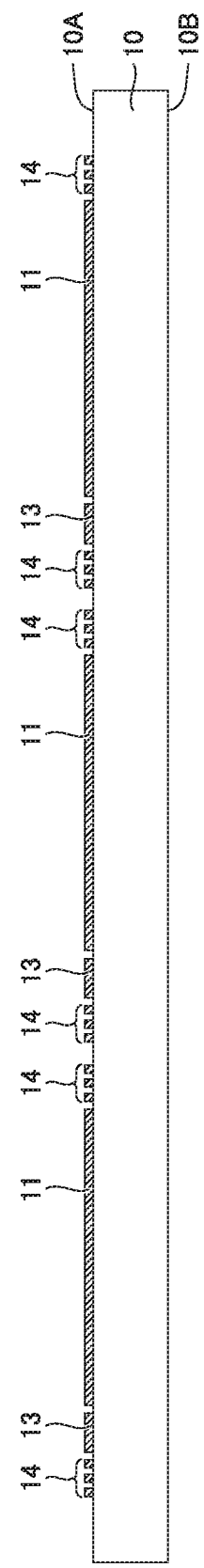
FIG. 3 is a cross-sectional view for illustrating the method of manufacturing a semiconductor device according to the present embodiment.

Then, as shown in FIG. 3, first electrode 11 is formed on first main surface 10A of semiconductor substrate 10 (step (S03)). The method of forming first electrode 11 can be any method, which is a sputtering method or a vapor deposition method, for example. Furthermore, the method of patterning first electrode 11 can be any method, which is a mask sputtering method or a lift-off method, for example. In the present step (S03), in addition to first electrode 11, control electrode 13 and guard ring 14 are formed on first main surface 10A of semiconductor substrate 10.

Figure 4:
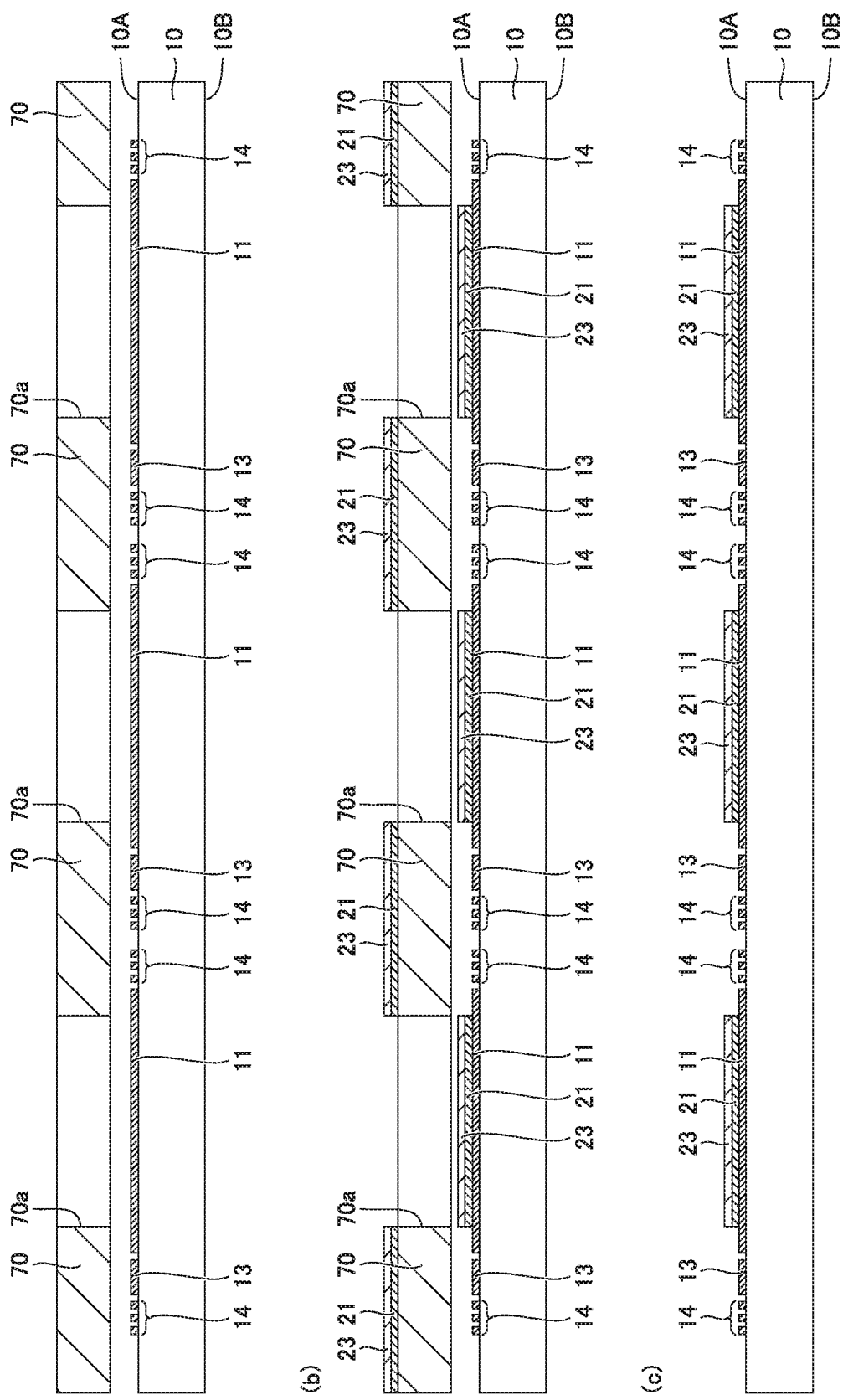
FIG. 4 is a cross-sectional view for illustrating the method of manufacturing a semiconductor device according to the present embodiment.

Then, as shown in FIG. 4, first solder-bonding metal film 21 and sacrificial film 23 are formed on first electrode 11 (step (S04)). The method of forming first solder-bonding metal film 21 and sacrificial film 23 can be any method, which is a sputtering method or a vapor deposition method, for example. FIG. 4 is a cross-sectional view showing the method of forming first solder-bonding metal film 21 and sacrificial film 23 by the sputtering method.

As shown in FIG. 4(a), a metal mask 70 for sputtering that has an opening 70a is prepared. Opening 70a of metal mask 70 is provided so as to be laid on the center portion of first electrode 11 on first main surface 10A (a region in which first solder-bonding metal film 21 is to be formed) in the direction crossing first main surface 10A (for example, in the perpendicular direction). In other words, metal mask 70 is formed so as to be laid, in the above-described crossing direction, on a region other than the region in which first solder-bonding metal film 21 is to be formed on first main surface 10A.

Then, as shown in FIG. 4(b), first solder-bonding metal film 21 and sacrificial film 23 are formed through metal mask 70. First solder-bonding metal film 21 and sacrificial film 23 are formed by the mask sputtering method. Thereby, as shown in FIG. 4(c), first solder-bonding metal film 21 and sacrificial film 23 are formed only on a region of first electrode 11 on which opening 70a is located.

The material forming sacrificial film 23 may be a material that is selectively removable by etching as compared with first solder-bonding metal film 21. This material forming sacrificial film 23 is formed of an element preferably having an atomic number equal to or less than 22 and not containing an alkali metal and an alkaline earth metal, and more preferably containing Titanium (Ti) or Al. In this way, in the step (S10) of removing sacrificial film 23 described later, sacrificial film 23 can be readily removed while suppressing etching of first solder-bonding metal film 21. Also in this way, first solder-bonding metal film 21 and sacrificial film 23 can be readily formed continuously in the same step.

The film thickness of sacrificial film 23 may be arbitrarily set in accordance with the condition for heat treatment performed after the present step (S04), the condition for etching in the step of removing sacrificial film 23, and the like. This film thickness of sacrificial film 23 is, for example, 0.02 µm or more and 1 µm or less, and preferably about 0.1 µm. In this way, in the heat treatment step performed after the present step (S04) (for example, in the ion implantation step or the thermal diffusion step in the step of forming an element structure on the third main surface 10C side), oxygen ($O_2$) can be prevented from reaching first solder-bonding metal film 21, and also, thermal oxidation of Ni contained in first solder-bonding metal film 21 can be prevented. Furthermore, by suppressing the film thickness of sacrificial film 23 to fall within the above-described value range, sacrificial film 23 can be readily formed or removed. Accordingly, the processing time in each of the steps of forming and removing sacrificial film 23 can be shortened, and also, a reduction of the manufacturing yield can be suppressed.

Figure 5:
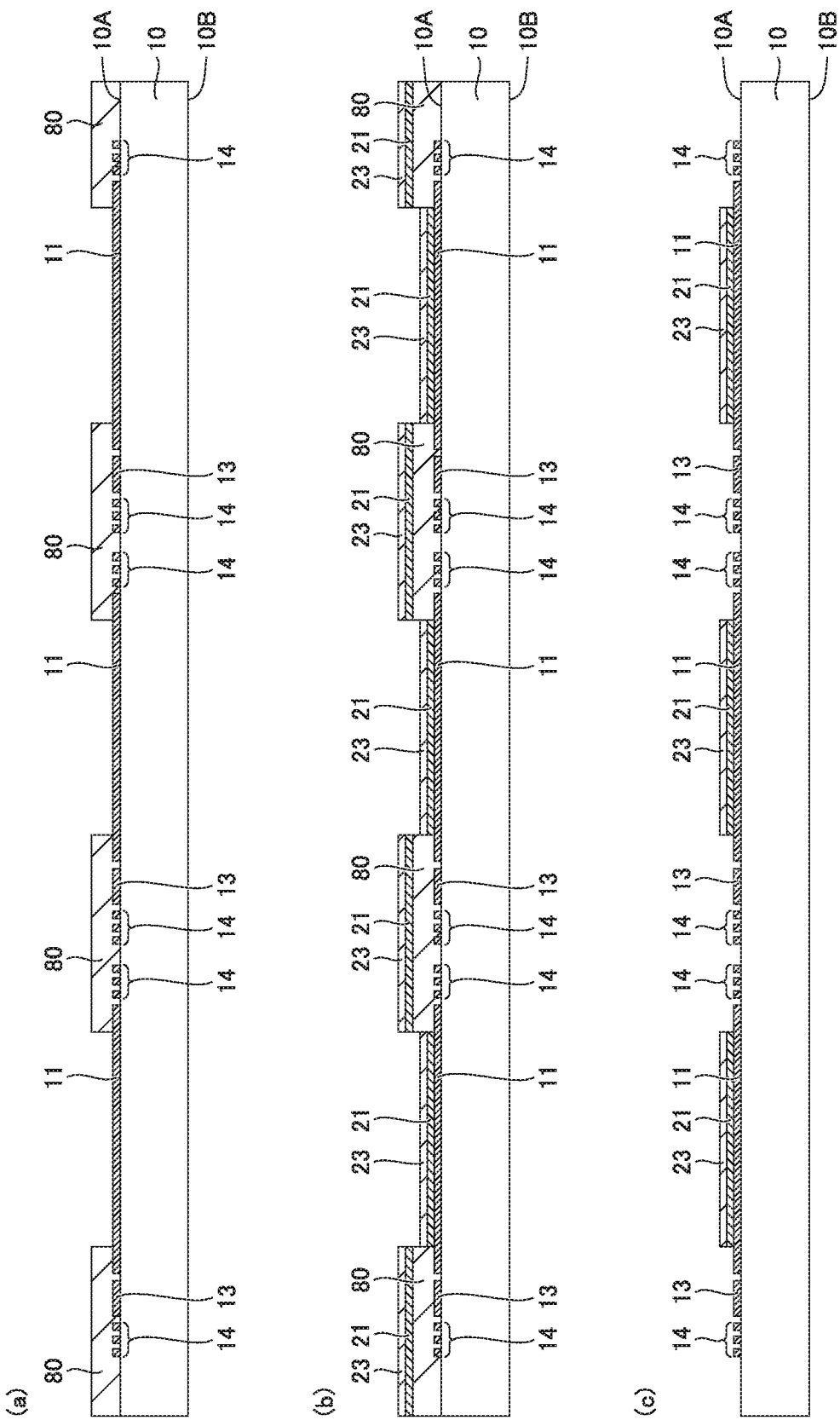
FIG. 5 is a cross-sectional view for illustrating the method of manufacturing a semiconductor device according to the present embodiment.

In addition, in the present step (S04), first solder-bonding metal film 21 and sacrificial film 23 may be formed by the lift-off method. FIG. 5 is a cross-sectional view showing the method of forming first solder-bonding metal film 21 and sacrificial film 23 by the lift-off method.

As shown in FIG. 5(a), a mask for lift off 80 having an opening 80a is prepared. Mask for lift off 80 is a resist film, for example, and is provided with opening 80a by the photoengraving process. Opening 80a is provided such that the center portion of first electrode 11 on first main surface 10A (a region in which first solder-bonding metal film 21 is to be formed) is exposed. In other words, mask for lift off 80 is formed so as to cover a region on first main surface 10A other than the region in which first solder-bonding metal film 21 is to be formed.

Then, as shown in FIG. 5(b), first solder-bonding metal film 21 and sacrificial film 23 are formed through mask for lift off 80. First solder-bonding metal film 21 and sacrificial film 23 are formed, for example, by the sputtering method. Thereby, first solder-bonding metal film 21 and sacrificial film 23 are formed on mask for lift off 80 and also on first electrode 11 exposed on the inside of opening 80a of mask for lift off 80. Then, mask for lift off 80 is removed by any method. Thereby, first solder-bonding metal film 21 and sacrificial film 23 formed on mask for lift off 80 are also removed from first main surface 10A. Then, as shown in FIG. 5(c), only first solder-bonding metal film 21 and sacrificial film 23 that are formed directly on first electrode 11 are remained.

In addition, first solder-bonding metal film 21 and sacrificial film 23 may be formed in separate steps. For example, in the present step (S04), after the step of forming first solder-bonding metal film 21, the step of forming sacrificial film 23 may be performed.

Figure 6:
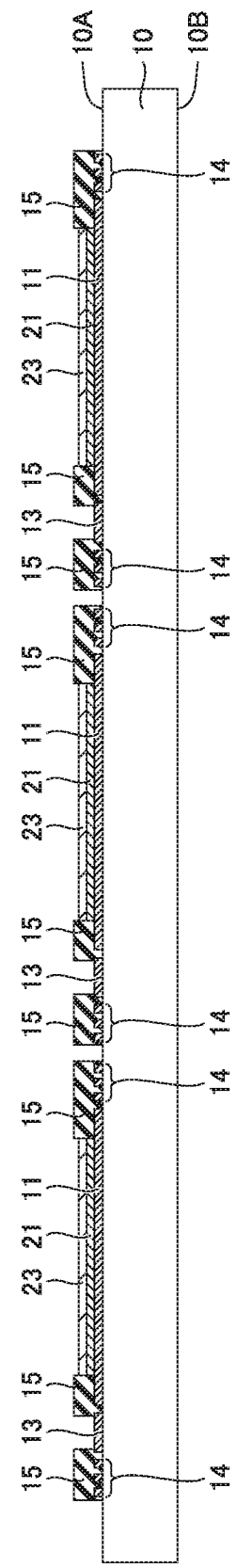
FIG. 6 is a cross-sectional view for illustrating the method of manufacturing a semiconductor device according to the present embodiment.

Then, as shown in FIG. 6, protective film 15 is formed on first main surface 10A (step (S05)). Specifically, protective film 15 is formed on first main surface 10A so as to cover the outer circumferential ends of first electrode 11 and first solder-bonding metal film 21, the outer circumferential end of control electrode 13, and the top of guard ring 14. When protective film 15 is made of photosensitive polyimide, protective film 15 is formed by the photoengraving process. Furthermore, when protective film 15 is made of non-photosensitive polyimide, non-photosensitive polyimide is applied onto first main surface 10A, and then, an etching mask is formed on the non-photosensitive polyimide using a photosensitive resist by the photoengraving process. Then, this etching mask is used to process the non-photosensitive polyimide, thereby forming protective film 15. Protective film 15 is preferably not formed on a region that is to be diced in the dicing step described later.

Figure 7:
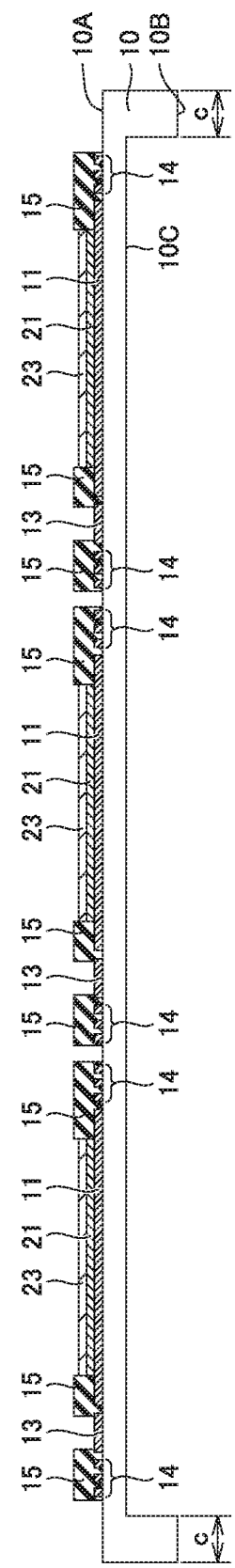
FIG. 7 is a cross-sectional view for illustrating the method of manufacturing a semiconductor device according to the present embodiment.

Then, as shown in FIG. 7, the rear surface (second main surface 10B) of semiconductor substrate 10 is ground (step (S06)). Specifically, second main surface 10B of semiconductor substrate 10 is ground while leaving an outer circumferential region c that is located at a prescribed distance (for example, 2 mm) from the outer circumferential end of semiconductor substrate 10 in the radial direction. Thereby, third main surface 10C is exposed. The film thickness of the portion ground in semiconductor substrate 10 (the distance between first main surface 10A and second main surface 10B) in this way is 100 μm, for example. The method of grinding semiconductor substrate 10 may be any method. By grinding only the inner region surrounded by outer circumferential region c while maintaining the film thickness of outer circumferential region c, occurrence of warpage and the like in semiconductor substrate 10 after grinding can be suppressed. In addition, the present step (S06) is performed in the state where noble metals such as gold (Au) and heavy metals such as Ni are not exposed on the first main surface 10A side and the third main surface 10C side. The present step (S06) is performed in the state where semiconductor substrate 10, first solder-bonding metal film 21, control electrode 13, and protective film 15 are exposed, in which case each of them does not contain noble metals and heavy metals as a constituent material. Accordingly, in the present step (S06), ground powder containing noble metals or heavy metals is prevented from adhering to the region and the like in which semiconductor substrate 10 is exposed on second main surface 10B and first main surface 10A formed by grinding.

Then, an element structure (not shown) of semiconductor element 1 is formed on the third main surface 10C side (step (S07)). For example, when semiconductor element 1 is formed as an IGBT, a collector region is formed by ion implantation and thermal diffusion into third main surface 10C. In the present step (S07), semiconductor substrate 10 is heated to a prescribed temperature. At this time, the ground powder containing noble metals or heavy metals does not adhere to the regions on third main surface 10C and first main surface 10A in which semiconductor substrate 10 is exposed. Thus, by the present step (S07), noble metals and heavy metals are prevented from being thermally diffused into semiconductor substrate 10.

Then, second electrode 12 is formed on the rear surface (third main surface 10C) of semiconductor substrate 10 (step (S08)). Second electrode 12 may be formed by any method and, for example, is formed by the sputtering method. At this time, in the state where semiconductor substrate 10 is heated to a prescribed temperature, a film of the material (for example, Al) forming second electrode 12 is formed on third main surface 10C, so that the electrical resistance of the bonding interface between the above-described collector region and second electrode 12 can be reduced. Furthermore, after a film of the material forming second electrode 12 is formed without heating semiconductor substrate 10, semiconductor substrate 10 is heated to a prescribed temperature, thereby also allowing the same effect to be achieved. It is to be noted that the heat treatment step for semiconductor substrate 10 in this case may be performed after the step (S09) of forming second solder-bonding metal film 22, which will be described later.

Then, second solder-bonding metal film 22 is formed on second electrode 12 (step (S09)). The method of forming second solder-bonding metal film 22 may be any method, which is a sputtering method or a vapor deposition method, for example. In the present step (S09), it is preferable that an anti-oxidizing film 24 is formed on second solder-bonding metal film 22. The material forming anti-oxidizing film 24 can be any material that cannot be oxidized easily as compared with second solder-bonding metal film 22, and is preferably Au. The film thickness of anti-oxidizing film 24 may be arbitrarily set in accordance with the condition for bonding to second external electrodes 42 and 52 via solder 32. For example, this film thickness of anti-oxidizing film 24 is 0.02 μm or more and 1 μm or less, and preferably about 0.1 μm.

In this way, second solder-bonding metal film 22 is covered by anti-oxidizing film 24, so that oxidation of second solder-bonding metal film 22 can be prevented, and thus, reduction of the solder wettability of second solder-bonding metal film 22 can be prevented. When the solder wettability of second solder-bonding metal film 22 is reduced, there may occur a problem that voids are produced within solder 32, and the heat conduction from semiconductor element 1 to second external electrodes 42 and 52 is inhibited on these voids, thereby causing local heat generation on these voids. On the other hand, if anti-oxidizing film 24 is formed, it becomes possible to suppress occurrence of voids within solder 32 connecting second solder-bonding metal film 22 and second external electrodes 42 and 52. Consequently, excellent heat conduction and electrical conduction can be realized over the entire bonding surface between second solder-bonding metal film 22 and upper electrode 42 (for example, the entire third main surface 10C).

In semiconductor device 100, the area of a region b where solder-bonding is implemented via solder 32 on the third main surface 10C side (see FIG. 1) is larger than the area of a region a where solder-bonding is implemented via solder 31 on the first main surface 10A side (see FIG. 1). Accordingly, solder 32 contributes more greatly to cooling of semiconductor element 1 than solder 31. Thus, it is preferable that occurrence of voids within solder 32 is suppressed over the entire surface of second solder-bonding metal film 22. For this purpose, it is preferable that anti-oxidizing film 24 is formed over the entire surface of second solder-bonding metal film 22.

Figure 8:
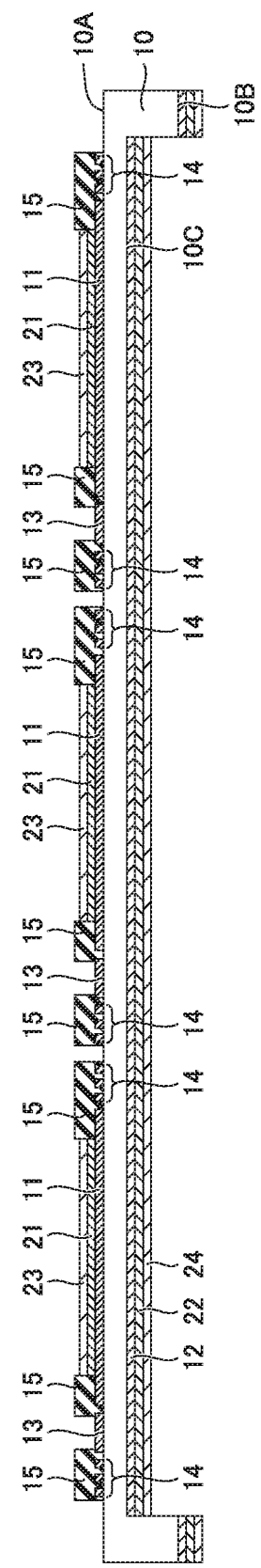
FIG. 8 is a cross-sectional view for illustrating the method of manufacturing a semiconductor device according to the present embodiment.

In this way, as shown in FIG. 8, second electrode 12, second solder-bonding metal film 22, and anti-oxidizing film 24 are formed on third main surface 10C of semiconductor substrate 10 so as to be stacked on one another. In addition, second electrode 12, second solder-bonding metal film 22, and anti-oxidizing film 24 may be formed continuously in the same step.

Figure 9:
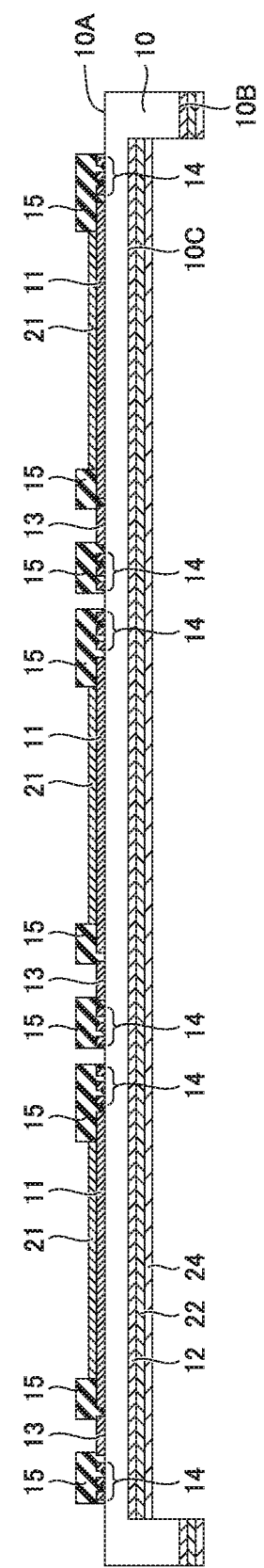
FIG. 9 is a cross-sectional view for illustrating the method of manufacturing a semiconductor device according to the present embodiment.

Then, as shown in FIG. 9, sacrificial film 23 is removed (step (S10)). The method of removing sacrificial film 23 may be any method, which is a wet etching method, for example. When the material forming sacrificial film 23 is Ti, the present step (S10) is performed, for example, by immersing first main surface 10A of semiconductor substrate 10 in fluoric acid. Also, when the material forming sacrificial film 23 is Al, the step (S10) is performed, for example, by immersing first main surface 10A of semiconductor substrate 10 in phosphoric acid. By using any method, sacrificial film 23 can be selectively removed by wet etching as compared with first solder-bonding metal film 21.

Then, as shown in FIG. 10, semiconductor substrate 10 is diced (step (S11)). Thereby, semiconductor element 1 is cut from semiconductor substrate 10. The method of dicing semiconductor substrate 10 may be any method, which is a blade dicing method, for example.

Then, first solder-bonding metal film 21 of semiconductor element 1 and first external electrode 41 are solder-bonded to each other (step (S12)). For example, solid-phase solder is disposed between first solder-bonding metal film 21 and first external electrode 41, which is then heat-treated and then cooled, so that first solder-bonding metal film 21 and first external electrode 41 are bonded to each other via solder 31. Similarly, solid-phase solder is disposed between second solder-bonding metal film 22 and upper electrode 42 of second external electrodes 42 and 52, which is then heat-treated and then cooled, so that second solder-bonding metal film 22 and second external electrodes 42 and 52 are bonded to each other via solder 32.

In this case, the present step (S12) is performed without performing heat treatment since after the previous step (S10) of removing sacrificial film 23. Thus, in the present step (S12), an oxide film caused by heat treatment is not formed on first solder-bonding metal film 21. However, since a natural-oxidation film may be formed on first solder-bonding metal film 21, heat treatment for heating semiconductor substrate 10 to a prescribed temperature under the reducing atmosphere may be performed as pretreatment of the present step (S12). In this way, the oxide films formed on first solder-bonding metal film 21 and on the surface of the solid-phase solder can be simultaneously removed, so that the solder wettability of first solder-bonding metal film 21 can be recovered. Also, since anti-oxidizing film 24 is formed on second solder-bonding metal film 22, no oxide film is formed thereon. When the film thickness of anti-oxidizing film 24 is about 0.1 μm, anti-oxidizing film 24 is diffused into solder 32 during solder-bonding between second solder-bonding metal film 22 and second external electrodes 42 and 52, so that this anti-oxidizing film 24 disappears.

Then, semiconductor element 1 is sealed by sealing body 60 (step (S13)). The step of forming sealing body 60 is performed, for example, by a transfer mold method. In this way, semiconductor device 100 as shown in FIG. 1 is manufactured.

Then, the functions and effects of the method of manufacturing a semiconductor device according to the present embodiment will be hereinafter described.

The method of manufacturing a semiconductor device according to the present embodiment includes: the step (S01) of preparing a semiconductor substrate 10 having a first main surface 10A and a second main surface 10B that is located on the opposite side of first main surface 10A; the step (S02) of forming a first electrode 11 on first main surface 10A; the step (S03) of forming a first solder-bonding metal film 21 (a solder-bonding metal film) on first electrode 11; the step (S04) of forming a sacrificial film 23 on first solder-bonding metal film 21; the step (S06) of grinding second main surface 10B after forming sacrificial film 23; the step (S07) of performing heat treatment after the grinding step (S06) (the step of forming an element structure on the third main surface 10C side); the step (S10) of removing sacrificial film 23 after the step (S07) of performing heat treatment; and the step (S12) of solder-bonding first solder-bonding metal film 21 and a first external electrode 41.

In this way, the step (S07) of performing heat treatment is performed after the step (S04) of forming sacrificial film 23 on first solder-bonding metal film 21. Thus, in the step (S07), sacrificial film 23 is formed on first solder-bonding metal film 21. The step (S10) of removing sacrificial film 23 is performed after the step (S07) of performing heat treatment. Then, the step (S12) of solder-bonding first solder-bonding metal film 21 and first external electrode 41 is performed. Accordingly, in the step (S12) of solder-bonding, a thermal oxide film caused by heat treatment is not formed on first solder-bonding metal film 21, but only a natural-oxidation film is formed thereon.

Thus, as a pretreatment before solder-bonding in the bonding step (S12), only a simple pretreatment for removing a natural-oxidation film is performed without forming an anti-oxidizing film made of noble metals on first solder-bonding metal film 21, with the result that first solder-bonding metal film 21 and first external electrode 41 may be excellently solder-bonded via solder 31 having no void produced therein.

Furthermore, sacrificial film 23 is to be eventually removed from semiconductor device 100. Thus, this sacrificial film 23 itself may be formed of an easily-oxidized material. Specifically, a film such as anti-oxidizing film 24 made of a heavy metal, which is not removed but remained on semiconductor device 100, does not need to be formed on first solder-bonding metal film 21. Thus, thermal oxidation of first solder-bonding metal film 21 can be suppressed by sacrificial film 23 made of materials that are lower in cost than that of anti-oxidizing film 24.

Furthermore, in the method of manufacturing a semiconductor device according to the present embodiment, the step of forming an anti-oxidizing film and the like on first main surface 10A is not performed after the grinding step (S06). Thus, occurrence of cracking in semiconductor substrate 10 is suppressed.

In other words, according to semiconductor device 100 manufactured by the method of manufacturing a semiconductor device of the present embodiment, the manufacturing cost is suppressed, cracking in the semiconductor substrate is suppressed, and first solder-bonding metal film 21 and first external electrode 41 are thermally and electrically connected excellently to each other via solder 31.

Furthermore, the step (S03) of forming first solder-bonding metal film 21 and sacrificial film 23 is performed before the grinding step (S07). Thus, this step (S03) is performed for semiconductor substrate 10 having a uniform film thickness before its film thickness is partially reduced. Thus, in the step (S03), since occurrence of warpage and the like in semiconductor substrate 10 is suppressed, first solder-bonding metal film 21 and sacrificial film 23 can be readily formed, for example, by the lift-off method and the like using a photoengraving process. Furthermore, when first solder-bonding metal film 21 and sacrificial film 23 are formed by the sputtering method, if the film thickness of semiconductor substrate 10 is partially reduced, the temperature of semiconductor substrate 10 partially rises abruptly, to thereby cause temperature unevenness, so that cracking and the like occur in semiconductor substrate 10. However, according to the method of manufacturing a semiconductor device of the present embodiment, first solder-bonding metal film 21 and sacrificial film 23 are formed on semiconductor substrate 10 having a uniform film thickness obtained before it is partially ground. Accordingly, occurrence of cracking and the like in semiconductor substrate 10 can be suppressed even if the sputtering method is employed. Also, in the present step (S03), occurrence of cracking and the like in semiconductor substrate 10 can be suppressed even when semiconductor substrate 10 is physically contacted during conveyance of semiconductor substrate 10, fixation of semiconductor substrate 10 and the like on the inside of each processing apparatus. Thus, semiconductor substrate 10 can be easily handled.

It is preferable that the material forming sacrificial film 23 is selectively removable by etching as compared with first solder-bonding metal film 21.

In this way, in the step (S10) of removing sacrificial film 23, sacrificial film 23 can be readily removed. Furthermore, since thinning of first solder-bonding metal film 21 is suppressed in the present step (S10), the mechanical strength of first solder-bonding metal film 21 can be maintained before and after this first solder-bonding metal film 21 and first external electrode 41 are solder-bonded to each other. Consequently, the reliability of the bonding interface between first solder-bonding metal film 21 and first external electrode 41 can be ensured.

It is preferable that the material forming first solder-bonding metal film 21 contains Ni. In this way, Ni in first solder-bonding metal film 21 can readily form an intermetallic compound with Sn as a main constituent material of solder 31, which allows an excellent bonding state to be achieved between first solder-bonding metal film 21 and first external electrode 41. Also in this way, first solder-bonding metal film 21 and first external electrode 41 can be readily solder-bonded to each other by a well-known method.

Furthermore, it is preferable that the material forming sacrificial film 23 contains at least one of Ti and Al. In this way, in the step (S10) of removing sacrificial film 23 described later, sacrificial film 23 can be readily removed while suppressing etching of first solder-bonding metal film 21. Also in this way, first solder-bonding metal film 21 and sacrificial film 23 can be readily formed continuously in the same step. Thereby, it becomes possible to manufacture semiconductor device 100, by which the manufacturing cost is reduced, and oxidation of the solder-bonding metal film is prevented so that a solder-bonding metal film and an external electrode are excellently solder-bonded to each other.

It is preferable that the method of manufacturing a semiconductor device according to the present embodiment includes the step (S05) of forming a protective film 15 on first main surface 10A of semiconductor substrate 10.

In this way, in the step (S12) of solder-bonding first solder-bonding metal film 21 and first external electrode 41, even when the so-called solder jumping (scattering of solder balls) occurs, it becomes possible to prevent electrical characteristics failures from occurring in semiconductor device 100 by such scattered solder.

In the method of manufacturing a semiconductor device according to the present embodiment, it is preferable that the step (S10) of removing sacrificial film 23 is performed after the step (S05) of forming protective film 15.

In this way, even when a residual of protective film 15 is produced in the step (S05) of forming protective film 15, this residual can be removed together with sacrificial film 23 by the etching process in the step (S10) of removing sacrificial film 23, which is performed later.

In the method of manufacturing a semiconductor device according to the present embodiment, it is preferable that the grinding step (S06) is performed after the step (S05) of forming protective film 15.

In this way, the step (S05) of forming protective film 15 and each of steps (S01 to S04) performed before the step (S05) are performed for semiconductor substrate 10 having a uniform film thickness obtained before its film thickness is partially reduced. Accordingly, in the step (S05), since occurrence of warpage and the like in semiconductor substrate 10 is suppressed, protective film 15 can be readily formed, for example, utilizing the photoengraving process. Also in the step (S05) of forming protective film 15, occurrence of cracking and the like in semiconductor substrate 10 can be suppressed, so that semiconductor substrate 10 can be readily handled.

It is preferable that the material forming protective film 15 contains polyimide. In this way, even when a residual of protective film 15 is produced in the step (S05) of forming protective film 15, this residual can be readily removed together with sacrificial film 23 by the etching process using fluoric acid or phosphoric acid in the step (S10) of removing sacrificial film 23, which is performed later.

It is preferable that the material forming first electrode 11 contains Al and the content rate of Al in first electrode 11 is 95 mass % or more. In this way, first electrode 11 may be readily formed by a well-known method. Furthermore, when metal wire 33 is formed as an Al wire, for the purpose of achieving the excellent reliability of bonding between metal wire 33 and control electrode 13, it is preferable that the material forming control electrode 13 contains Al and the content rate of Al in control electrode 13 is 95 mass % or more. Also in such a case, if first electrode 11 is configured as described above, first electrode 11 and control electrode 13 can be simultaneously formed on first main surface 10A in the step of forming first electrode 11.

In addition, the method of manufacturing a semiconductor device 100 according to the present embodiment does not necessarily have to be performed in the above-described order with regard to the sequential order relation among steps other than the following steps, as long as: after forming sacrificial film 23, the grinding step (S06) is performed; after this step (S06), the step (S07) of forming an element structure on the third main surface 10C side is performed; after the step (S07), the step (S10) of removing sacrificial film 23 is performed; and after the step (S10), the solder-bonding step (S12) is performed. For example, after formation of first solder-bonding metal film 21, protective film 15 may be formed, and then, sacrificial film 23 may be formed. In this case, sacrificial film 23 may be formed, for example, on first solder-bonding metal film 21 and on a portion of protective film 15 that faces an opening through which first solder-bonding metal film 21 is exposed. Also in this way, the same functions and effects as those achieved by the method of manufacturing a semiconductor device according to the present embodiment can be achieved.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

INDUSTRIAL APPLICABILITY

The present invention is applicable particularly advantageously to a method of manufacturing a semiconductor device having a semiconductor substrate that has a semiconductor element solder-bonded to an external electrode and that is ground to have a reduced film thickness.

REFERENCE SIGNS LIST

1 semiconductor element, 10 semiconductor substrate, 10A first main surface, 10B second main surface, 10C third main surface, 11 first electrode, 12 second electrode, 13 control electrode, 14 guard ring, 15 protective film, 21 first solder-bonding metal film, 22 second solder-bonding metal film, 23 sacrificial film, 24 anti-oxidizing film, 31, 32, 34 solder, 33 metal wire, 41 first external electrode, 42 upper electrode (second external electrode), 52 lower electrode (second external electrode), 43 third external electrode, 44 fourth external electrode, 60 sealing body, 70 metal mask, 70*a*, 80*a* opening, 80 mask for lift off, 100 semiconductor device.

The invention claimed is:

1. A method of manufacturing a semiconductor device, the method comprising:
preparing a semiconductor substrate having a first main surface and a second main surface that is located on an opposite side of the first main surface;
forming a first electrode on the first main surface;
forming a solder-bonding metal film on the first electrode;
forming a sacrificial film on the solder-bonding metal film;
grinding the second main surface after forming the sacrificial film;
performing heat treatment after the grinding;
removing the sacrificial film after the performing heat treatment; and
solder-bonding the solder-bonding metal film and an external electrode, a material forming the sacrificial film being made of an element that has an atomic number equal to or less than 22 and that does not contain an alkali metal and an alkaline earth metal.

2. The method of manufacturing a semiconductor device according to claim 1, wherein the material forming the sacrificial film is selectively removable by etching as compared with the solder-bonding metal film.

3. The method of manufacturing a semiconductor device according to claim 1, wherein the material forming the sacrificial film contains at least one of titanium and aluminum.

4. The method of manufacturing a semiconductor device according to claim 1, wherein a material forming the solder-bonding metal film contains a metal element having an atomic number equal to or greater than 23.

5. The method of manufacturing a semiconductor device according to claim 4, wherein the material forming the solder-bonding metal film contains nickel.

6. The method of manufacturing a semiconductor device according to claim 1, comprising: forming a protective film on the first main surface of the semiconductor substrate.

7. The method of manufacturing a semiconductor device according to claim 6, wherein the removing the sacrificial film is performed after the forming a protective film.

8. The method of manufacturing a semiconductor device according to claim 6, wherein the grinding is performed after the forming a protective film.

9. The method of manufacturing a semiconductor device according to claim 6, wherein a material forming the protective film contains polyimide.

10. The method of manufacturing a semiconductor device according to claim 1, wherein
a material forming the first electrode contains aluminum, and
a content rate of aluminum in the first electrode is 95 mass % or more.

* * * * *